United States Patent [19]
Tuttle

[11] Patent Number: 6,058,497
[45] Date of Patent: May 2, 2000

[54] TESTING AND BURN-IN OF IC CHIPS USING RADIO FREQUENCY TRANSMISSION

[75] Inventor: Mark E. Tuttle, Boise, Id.

[73] Assignee: Micron Technology, Inc., Boise, Id.

[21] Appl. No.: 07/979,607

[22] Filed: Nov. 20, 1992

[51] Int. Cl.[7] .................................................. G06F 11/00
[52] U.S. Cl. ............................................ 714/733; 714/30
[58] Field of Search ................................ 455/67.1, 67.4, 455/41, 127, 129; 714/25, 46, 41, 735, 30, 733, 734, 736; 371/15.1, 22.1; 370/13, 15; 375/10

[56] References Cited

U.S. PATENT DOCUMENTS

| | | | |
|---|---|---|---|
| 3,689,885 | 9/1972 | Kaplan et al. | 340/825.34 |
| 4,930,129 | 5/1990 | Takahira | 371/40.4 |
| 4,962,485 | 10/1990 | Kato et al. | 365/229 |
| 5,068,521 | 11/1991 | Yamaguchi | 235/492 |
| 5,113,184 | 5/1992 | Katayama | 340/825.54 |
| 5,182,442 | 1/1993 | Takahira | 235/492 |
| 5,198,647 | 3/1993 | Mizuta | 235/449 |
| 5,202,838 | 4/1993 | Inoue | 364/480 |
| 5,212,373 | 5/1993 | Fujioka et al. | 235/492 |
| 5,220,158 | 6/1993 | Takahira et al. | 235/492 |
| 5,226,167 | 7/1993 | Yamaguchi | 395/800 |
| 5,252,914 | 10/1993 | Bobbitt et al. | 324/158 S |
| 5,274,221 | 12/1993 | Matsubara | 235/492 |
| 5,343,478 | 8/1994 | James et al. | 371/22.3 |

Primary Examiner—Dieu-Minh T. Le
Assistant Examiner—Pierre Eddy Elisca
Attorney, Agent, or Firm—Wells, St. John, Roberts, Gregory & Matkin, P.S.

[57] ABSTRACT

A testing system evaluates one or more integrated circuit chips using RF communication. The system includes an interrogator unit with a radio communication range, and an IC chip adapted with RF circuitry positioned remotely from the interrogator unit, but within the radio communication range. The interrogator unit transmits a power signal to energize the IC chip during test procedures, and interrogating information for evaluating the operation of the IC chip. Test results are transmitted by the IC chip back to the interrogator unit for examination to determine whether the IC chip has a defect. In this manner, one or more IC chips can be evaluated simultaneously without physically contacting each individual chip.

22 Claims, 3 Drawing Sheets

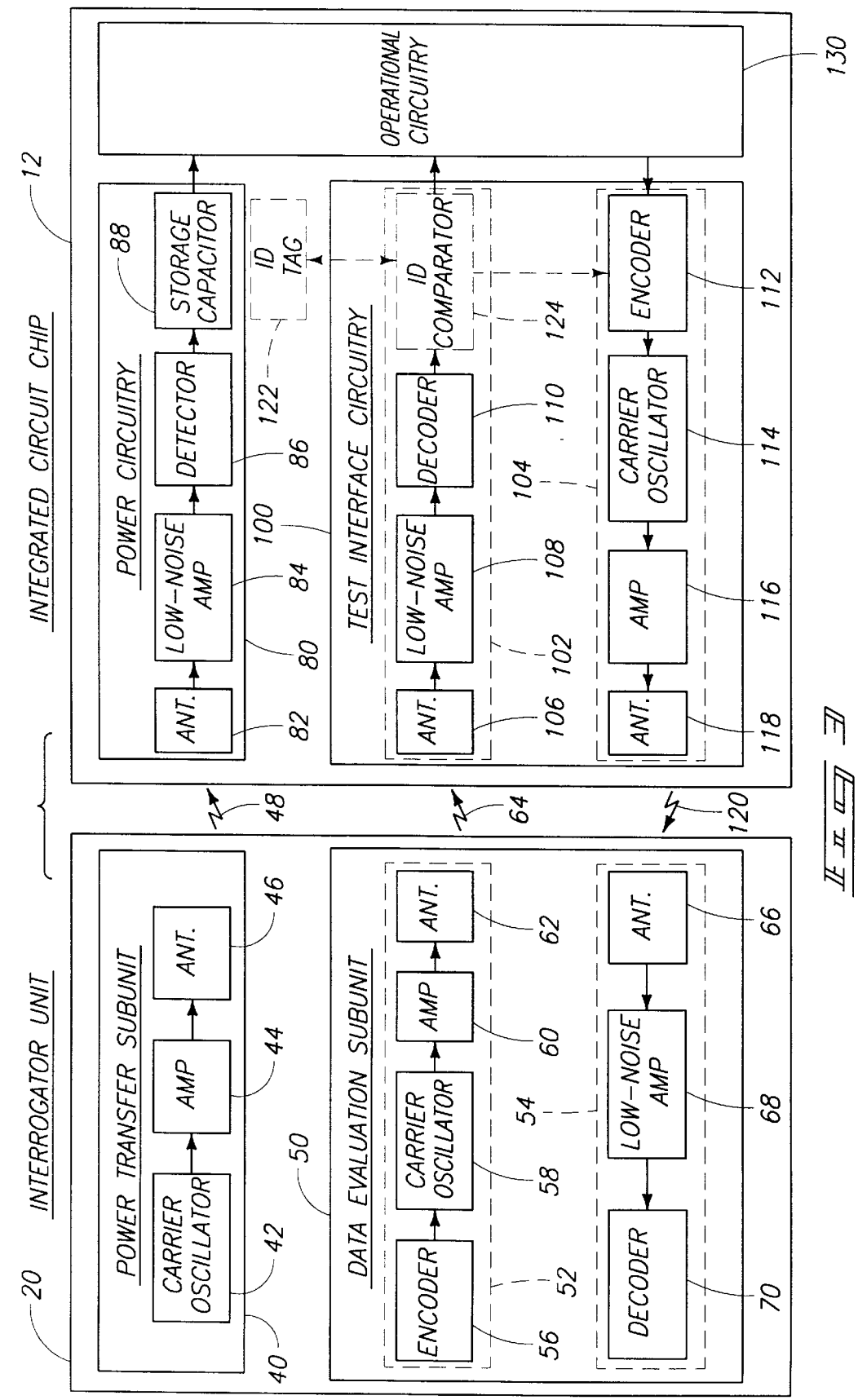

6,058,497

TESTING AND BURN-IN OF IC CHIPS USING RADIO FREQUENCY TRANSMISSION

TECHNICAL FIELD

This invention relates to systems for testing integrated circuit chips. This invention also relates to methods for conducting such tests.

BACKGROUND OF THE INVENTION

Processed semiconductor wafers typically comprise an array of substantially isolated integrated circuitry which are individually referred to as "die". The "die" are also commonly referred to as "chips" and comprise the finished circuitry components of, for example, processors and memory circuits. Common types of memory circuits include DRAM and SRAM chips.

After a semiconductor wafer has been fabricated, not all chips provided on the wafer prove operable, resulting in less than 100% yield. Accordingly, individual die must be tested for functionality. The typical test procedure for DRAM or SRAM circuitry is to first etch the upper protective passivation layer to expose desired bonding pads on the individual die. Thereafter, the wafer is subjected to test probing whereby the individual die are tested for satisfactory operation. Inoperable die are typically marked by an ink mark. After testing, the wafer is severed between individual chips. The operable, non-marked die are collected.

The operable individual die are then assembled in final packages of either ceramic or plastic. After packaging, the die are loaded into burn-in boards which comprise printed circuit boards having individual sockets. The burn-in boards are placed into a burn-in oven, and the parts are subjected to burn-in testing during which the die are operated for a period of time at different temperature cycles, including high temperatures. The die are stressed to accelerate their lives in an effort to identify the weak die which are likely to fail. Manufacturers predict early failures, known as "infant mortalities", to occur within a predetermined period of time of the burn-in cycle. Burn-in testing is conducted for a period of time sufficient to reveal these infant mortalities. For example, if infant mortalities are expected to occur within forty-eight hours of burn-in testing, the burn-in tests can be completed within this time period. In this manner, semiconductor wafer manufacturers can effectively test the quality of their chips in a reasonable time frame prior to shipping the chips to consumers.

According to the above testing procedures, the die are subjected to a preliminary wafer-level test before severing, and a burn-in test after severing and packaging of the individual die. Each of these two separate tests require some physical connection with testing apparatus. During the wafer-level test (before severing individual die), portions of the wafer passivation are removed to expose test bonding pads, and then test probes are employed to directly contact these test bonding pads. During the burn-in testing (after severing the individual die), each individual chip must be inserted into burn-in boards for the test.

This invention provides a system and method for preliminary wafer-level testing and burn-in testing without physically contacting the semiconductor wafer or individual die.

BRIEF DESCRIPTION OF THE DRAWINGS

Preferred embodiments of the invention are described below with reference to the following accompanying drawings.

FIG. 3 is a block diagram illustrating the radio frequency communication system according to the present invention.

DETAILED DESCRIPTION OF THE PREFERRED EMBODIMENTS

Figure 1:
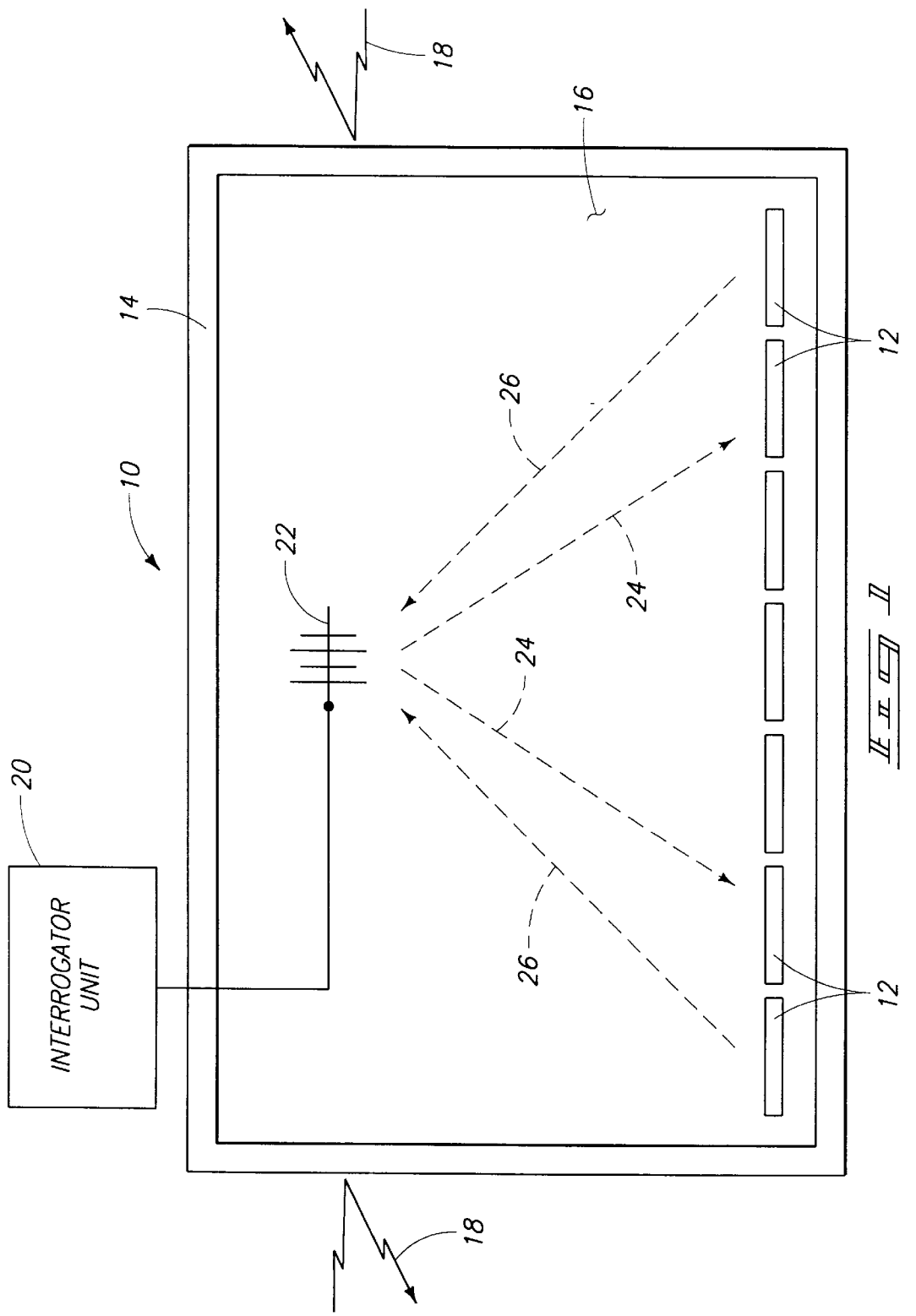
FIG. 1 is a diagrammatic illustration of a testing system according to one aspect of the present invention.

This disclosure of the invention is submitted in furtherance of the constitutional purposes of the U.S. Patent Laws "to promote the progress of science and useful arts" (Article 1, Section 8).

According to an aspect of this invention, a testing system for evaluating an integrated circuit chip comprises:

(A) an interrogator unit having a radio communication range, the interrogator unit comprising data evaluation means for transmitting interrogating information via radio communication and for receiving test data via radio communication;

(B) an integrated circuit chip positioned remotely from the interrogator unit, but within the radio communication range, comprising:
   operational circuitry;
   test interface circuitry electrically coupled to the operational circuitry and including means for receiving the interrogating information from the data evaluation means of the interrogator unit, the test interface circuitry test cycling the operational circuitry according to the interrogating information, the test interface circuitry including means for transmitting via radio communication test data output by the operational circuitry in response to the interrogating information back to the data evaluation means of the interrogator unit; and
   the data evaluation means including means for examining the test data to determine whether the integrated circuit chip has a defect.

According to another aspect of the invention, the testing system further comprises:
   an RF isolating housing for holding the interrogator unit and the integrated circuit chip, the housing defining a chamber which allows radio communication between the interrogator unit and the integrated circuit chip while blocking RF signals exterior to the housing from entering the chamber.

According to yet another aspect of this invention, the data evaluation means of the interrogator unit includes a means for providing an identification code as part of the interrogating information, an integrated circuit chip further comprises:
   tag means for storing an ID label identifying the integrated circuit chip; and
   the test interface means including discriminating means for comparing the identification code sent by the data evaluation means with the ID label stored by the tag means, the test interface means test cycling the operational circuitry when the identification code matches the ID label.

According to another aspect of this invention, a testing system for evaluating integrated circuit chips comprises:
(A) an interrogator unit having a radio communication range, comprising:
   power transfer means for transmitting via radio communication a power signal having a power inducing frequency and amplitude;

data evaluation means for transmitting interrogating information via radio communication and for receiving test data via radio communication;

(B) an integrated circuit chip positioned remotely from the interrogator unit, but within the radio communication range, comprising:

operational circuitry;

power circuitry electrically coupled to the operational circuitry and including means for receiving the power signal from the power transfer means of the interrogator unit, the power circuitry generating power from the power signal and supplying the power to the operational circuitry; and test interface circuitry electrically coupled to the operational circuitry and including means for receiving the interrogating information from the data evaluation means of the interrogator unit, the test interface circuitry test cycling the operational circuitry according to the interrogating information, the test interface circuitry including means for transmitting via radio communication test data output by the operational circuitry in response to the interrogating information back to the data evaluation means of the interrogator unit;

the data evaluation means including means for examining the test data to determine whether the integrated circuit chip has a defect.

FIG. 1 diagrammatically illustrates a testing system according to one embodiment of this invention. The testing system of this invention is designed to test multiple die or integrated circuit (IC) chips at different phases of the manufacturing process. For example, the IC chips can be evaluated at the semiconductor wafer level, or after separation into individual die, or after packaging of the individual die. This testing system evaluates individual integrated circuits in a contactless manner without the use of probes or burn-in test boards. Instead, this testing system employs radio communication to interrogate individual IC chips without physically contacting them.

Testing system 10 is shown as simultaneously evaluating multiple integrated circuit chips 12. System 10 includes radio frequency (RF) isolated housing 14, such as a grounded conductive shielding, which is impervious to interfering RF signals. Housing 14 defines a chamber 16 which holds IC chips 12. RF isolated housing 14 prevents RF signals 18, which originate external to housing 14, from entering into chamber 16. In this manner, the radio-based testing is conducted free of external interference or other unwanted noise.

Testing system 10 has an interrogator unit 20 (described below in more detail) provided outside housing 14 and a transmitting device 22 provided within housing 14. Transmitting device 22 is preferably an omni-directional antenna of sufficient dimensions to emit RF signals 24 to IC chips 12. Preferably, the strength of the RF signal and the proximity of the IC chips to antenna 22 are such that all IC chips 12 are in radio communication with interrogator unit 20. RF isolated housing 14 facilitates radio communication within chamber 16 while blocking external RF signals 18 from entering the chamber.

Individual IC chips contain RF receiving and transmitting circuitry which allows the IC chips to receive RF signals 24 from interrogator unit 20 and to transmit RF signals 26 back to interrogator unit 20 via antenna 22. The RF circuitry consumes very little space on each IC circuit. Interrogator unit 20 transmits both power signals to energize the IC chips 12 and data information to test the IC chips 12. In this manner, the testing system can evaluate IC chips positioned remotely from interrogator unit 20, but within the radio communication range. Such contactless testing is suitable at many different manufacturing stages, thereby eliminating mechanical probes or other test equipment which require physically contacting the individual IC chips.

Interrogator unit 20 is preferably positioned outside of RF isolated housing 14 and electrically coupled to antenna 22 which remains within chamber 16. Interrogator unit 20 may comprise, for example, a computer (such as a work station or PC) which is adapted with an RF communication circuit board and programmed to conduct the various tests on IC chips 12. In an alternative embodiment, however, interrogator unit 20 may be positioned inside housing 14, such as a specially designed electronic component which can be mounted therein.

Because testing system 10 simultaneously evaluates numerous IC chips 12, individual IC chips are provided with an identification scheme which permits interrogator unit 20 to identify and discriminate against certain IC chips. Various available protocols may be used to eliminate simultaneous identification among two or more IC chips. One known method is the Computer Network Communications Protocol which sequentially eliminates IC chips until the desired chip is discovered. One preferred identification scheme is discussed below in more detail.

Figure 2:
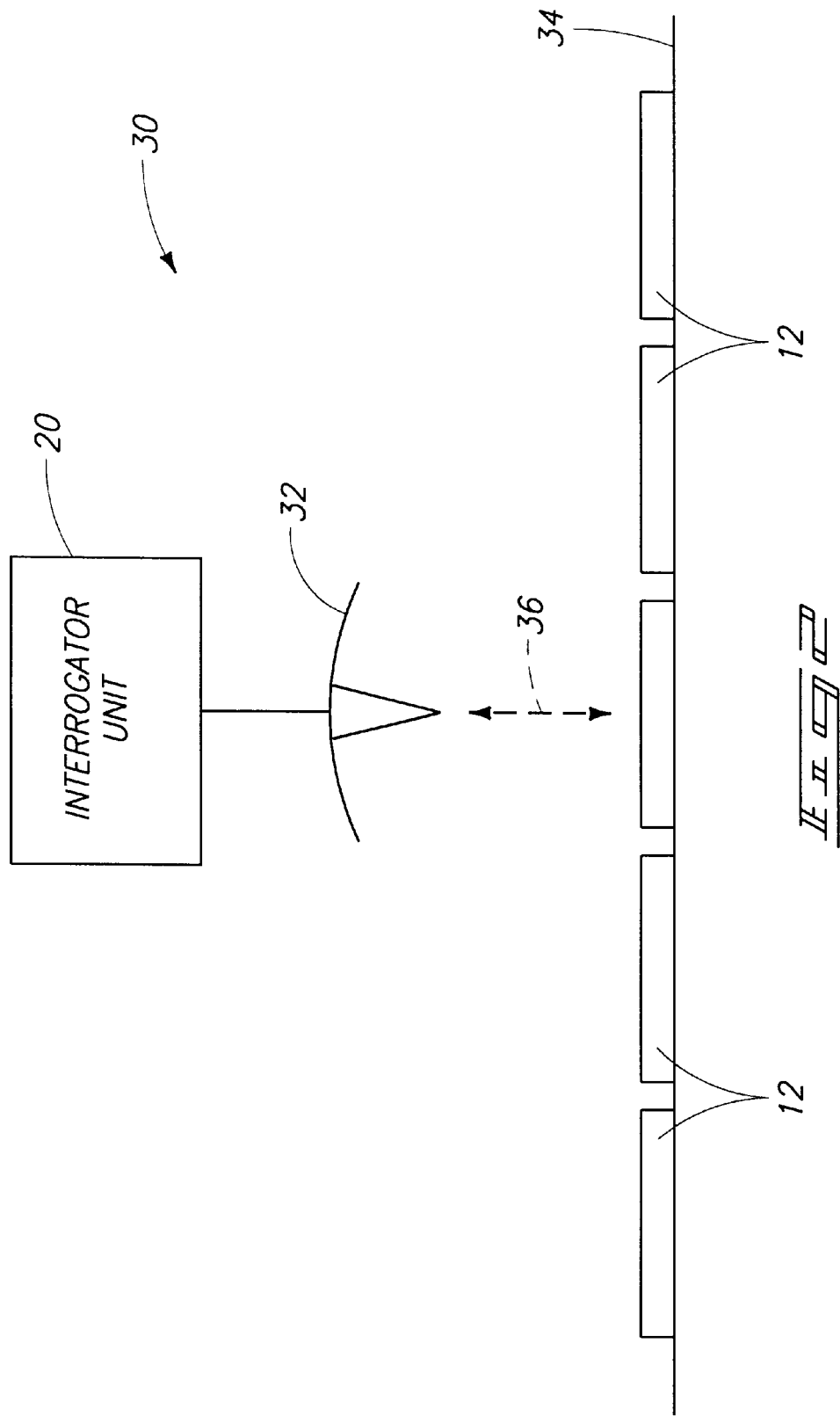
FIG. 2 is a diagrammatic illustration of a testing system according to another aspect of this invention.

FIG. 2 illustrates a testing system 30 according to a second embodiment of this invention. Testing system 30 includes an interrogator unit 20 coupled to a directional antenna 32. Testing system 30 further includes a support chuck or platform 34, which preferably comprises a positionally controllable platform that moves IC chips 12 at a selected pace beneath directional antenna 32. In this manner, interrogator unit 20 evaluates individual IC chips in an individually selectable manner. Directional antenna 32 transmits and s receives RF signals 36 from a single IC chip 12. As an alternative to positionally controllable platform 34, antenna 32 can be designed to be moved physically or electronically relative to stationary IC chips 12.

Evaluating IC chips using radio frequency transmission provides a number of advantages. First, the IC chips can be tested without having to make electrical contact with each chip, as is required by prior art test systems. A second advantage is that more chips can be evaluated at a higher rate. During burn-in testing, for example, substantially more IC chips can be placed in an oven for burn-in because the testing system no longer needs to contact each individual chip. This improves testing efficiency. A third advantage is that precise electrical connection to tiny contacts on every IC chip is not required for testing. A fourth advantage is that parametric and/or live circuit information which is being generated under harsh environmental conditions can be monitored in real time without using IC contacts.

FIG. 3 is a block diagram of an interrogator unit 20 and an integrated circuit chip 12 constructed according to one embodiment of this invention. Interrogator unit 20 includes a power transfer subunit 40 and a data evaluation subunit 50. Integrated circuit chip 12 includes power circuitry 80 which interacts with power transfer subunit 40 of interrogator unit 20, and test interface circuitry 100 which interacts with data evaluation subunit 50 of interrogator unit 20. IC chip 12 further includes operational circuitry 130 which consists of the components and elements for which the IC chip 12 is designed. For example, operational circuitry 130 represents the memory cells and peripheral cells of a RAM or ROM chip. Operational circuitry 130 may also represent the control logic of a microcontroller or other intelligent IC chip.

Power transfer subunit 40 includes carrier oscillator circuitry 42 which generates an RF "power" signal of a selected frequency, an amplifier 44 which amplifies the power signal and an antenna 46 to transmit the power signal (represented by arrow 48) to IC chip 12. Carrier oscillator 42, amplifier 44, and antenna 46 provide a power transfer means for transmitting via radio communication a power signal having a power inducing frequency and amplitude. Each of these components, and their operation, are well known to those skilled in the art.

Data evaluation subunit 50 includes a data transmission component 52 which is responsible for transmitting test data to test interface circuitry 100 of IC chip 12 and a data reception component 54 which is dedicated to receiving information indicative of the test results from test interface circuitry 100. Data transmission component 52 includes an encoder 56, a carrier oscillator 58, an amplifier 60, and an antenna 62. Encoder 56 converts the desired testing instructions into a compatible data format of serial bits which are then applied to a carrier frequency and transmitted as an interrogating information signal (represented as arrow 64) to IC chip 12. The information provided by encoder 56 may also contain an identification code for selecting a specific IC chip 12 or a specific class of chips.

Data reception component 54 has an antenna 66, a low-noise amplifier 68, and a decoder 70. In this manner, data evaluation subunit 50 provides a means for transmitting interrogating information via radio communication to IC chip 12 and for receiving test data via radio communication from IC chip 12.

Power circuitry 80 of IC chip 12 has an antenna 82, a low-noise amplifier 84, a detector 86, and a storage capacitor 88. The power signal 48 transmitted by power transfer subunit 40 is received by antenna 82 and amplified. Energy is captured from the oscillating signal and stored by capacitor 88. This energy is then supplied to operational circuitry 130 to provide power during the testing procedures.

In an alternative embodiment, however, the IC chip may be powered independently of the power signal transmitted by power transfer subunit 40. For example, power may be supplied directly to the IC chip via some external socket or probe. Although this requires a physical connection to the IC chip, the one or two probes required for powering the IC chip is easily manageable from a manufacturing and testing perspective and is still a marked improvement over the multiple probes presently required to adequately test an IC chip. For such IC chips, interrogator unit 20 can be constructed without power transfer subunit 40.

Test interface circuitry 100 includes a data reception component 102 which receives the interrogating information 64 from data evaluation subunit 50 and data transmission component 104 which transmits test results back to data evaluation subunit 50. Data reception component 102 has an antenna 106, a low-noise amplifier 108, and a decoder 110. The interrogating information 64 is received via antenna 106, amplified, and then decoded in decoder 110. This information is then passed to operational circuitry 130 to test cycle the circuitry.

Results from the test cycling indicative of normal operation or of a potential defect are returned from operation circuitry 130 to data transmission component 104. More particularly, component 104 includes an encoder 112 which encodes the test data results in a compatible format, a carrier oscillator 114, an amplifier 116, and an antenna 118. A test data signal (represented by arrow 120) is transmitted back to data evaluation subunit 50 via radio communication. The test result information is then examined at the interrogator unit to determine whether the integrated circuit chip has a defect, or operates properly. Interrogator unit 20 can be equipped with special logic circuitry to evaluate the test results. Alternatively, the interrogator unit can be connected to a data processing computer which examines the test results.

According to another aspect of this invention, an identification tag system can also be formed on IC chip 12 to discriminate against incoming interrogating information. Such a system includes an identification tag 122 which contains a unique identification label which is set during manufacturing by electrical fuses, laser fuses, masked programming, or the like. Alternatively, ID tag 122 can be assigned an identification label during initial testing if non-volatile devices (i.e., PROM, EPROM, EEPROM, etc.) are provided on the chips.

An identification comparator 124 would be positioned between decoder 110 and operational circuitry 130 to determine whether the interrogating information transmitted by interrogator unit 20 is directed to the specific IC chip 12. The interrogating information transmitted via signal 64 preferably contains an identification code which is compared to the ID label contained in ID tag 122. If the identification code matches the label, ID comparator 124 passes the test information to operational circuitry for test cycling procedures. On the other hand, if the identification code does not match the ID label, comparator 124 blocks the interrogating information from entering operational circuitry 130. In this manner, interrogator unit 20 can discriminate among numerous IC chips to thereby conduct specific test procedures on identifiable individual or classes of chips.

The block diagram of FIG. 3 illustrates basic well known components for description purposes. Some of these depicted components or circuits can easily be combined as one component. For example, in practice, only a single antenna is employed in interrogator unit 20 and only one antenna is used in IC chip 12. Encoding and decoding functions may also be accomplished using an integrated component.

Various known spread spectrum techniques may be used to facilitate RF communication, including: (1) direct sequence, (2) frequency hopping, (3) pulsed FM or chirped modulation, and (4) time hopping or time-frequency hopping used with pulse amplitude modulation, simple pulse amplitude modulation, or binary phase shift keying. The various signals (i.e., power signal 48, interrogating information 64, and test data signal 120) may be transmitted at three different frequencies.

The power circuitry and test interface circuitry formed on integrated circuit chip 12 consumes a comparatively small area of the entire IC chip. A current ULSI circuit has approximately 8 million circuit elements. The RF power and test interface circuitry of this invention consumes only approximately 30,000 elements. The on-chip antenna and storage capacitor is preferably formed relatively small since most of the testing is intended to be conducted in close proximity to the interrogating unit.

According to another aspect of this invention, a method for testing an integrated circuit chip having operational circuitry formed thereon comprises the following steps:

forming power circuitry on an integrated circuit chip having operational circuitry, the power circuitry being electrically coupled to the operational circuitry;

forming test interface circuitry on the integrated circuit chip, the test interface circuitry being electrically coupled to the operational circuitry;

providing an interrogator unit having a radio communication range;

locating the integrated circuit chip remotely from the interrogator unit, but within the radio communication range;

transmitting a power signal having a power inducing frequency and amplitude from the interrogator unit to the power circuitry on the integrated circuit chip via radio communication;

generating power in the integrated circuit chip from the power signal;

supplying the power to the operational circuitry;

transmitting interrogating information from the interrogator unit to the test interface circuitry on the integrated circuit chip via radio communication;

test cycling the operational circuitry according to the interrogating information;

transmitting test data output by the operational circuitry in response to the interrogating information back to the interrogator unit via radio communication; and examining the test data at the interrogator unit to determine whether the integrated circuit chip has a defect.

With reference to FIG. 3, this invention provides a method for testing one or more integrated circuit chips in a contactless manner. A power signal is transmitted from interrogator unit 20 to remotely located IC chip 12. The received power signal is amplified and stored by capacitor 88. The energy is then supplied to operational circuitry 130 as long as the tests are being conducted.

Interrogator unit 20 also transmits interrogating information to IC chip 12 to test cycle operational circuitry 130. Interrogating information may include an identification code which is compared to an ID label previously marked on IC chip 12. This ID label provides levels of discrimination among multiple IC chips. If the code matches the label, the test interrogating information is sent to operational circuitry 130.

Operational circuitry is then subjected to various tests which are designed to determine whether the IC chip has a defect. The test results are transmitted from IC chip 12 back to interrogator unit 20 and examined. If the IC chip has a defect, it is marked and removed from the remaining operable chips.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A testing system for evaluating an integrated circuit chip comprising:

(A) an interrogator unit having a radio communication range, the interrogator unit comprising data evaluation means for transmitting interrogating information via radio communication and for receiving test data via radio communication;

(B) an integrated circuit chip positioned remotely from the interrogator unit, but within the radio communication range, comprising:
   operational circuitry;
   test interface circuitry electrically coupled to the operational circuitry and including means for receiving the interrogating information from the data evaluation means of the interrogator unit, the test interface circuitry test cycling the operational circuitry according to the interrogating information, the test interface circuitry including means for transmitting via radio communication test data output by the operational circuitry in response to the interrogating information back to the data evaluation means of the interrogator unit; and
   the data evaluation means including means for examining the test data to determine whether the integrated circuit chip has a defect.

2. A testing system according to claim 1, further comprising:
   an RF isolating housing for holding the interrogator unit and the integrated circuit chip, the housing defining a chamber which allows radio communication between the interrogator unit and the integrated circuit chip while blocking RF signals exterior to the housing from entering the chamber.

3. A testing system according to claim 1, wherein:
   the data evaluation means of the interrogator unit includes means for providing an identification code as part of the interrogating information;
   and wherein the integrated circuit chip further comprises:
   tag means for storing an ID label identifying the integrated circuit chip; and
   the test interface means including discriminating means for comparing the identification code sent by the data evaluation means with the ID label stored by the tag means, the test interface means test cycling the operational circuitry when the identification code matches the ID label.

4. A testing system for evaluating an integrated circuit chip comprising:

(A) an interrogator unit having a radio communication range, comprising:
   power transfer means for transmitting via radio communication a power signal having a power inducing frequency and amplitude;
   data evaluation means for transmitting interrogating information via radio communication and for receiving test data via radio communication;

(B) an integrated circuit chip positioned remotely from the interrogator unit, but within the radio communication range, comprising:
   operational circuitry;
   power circuitry electrically coupled to the operational circuitry and including means for receiving the power signal from the power transfer means of the interrogator unit, the power circuitry generating power from the power signal and supplying the power to the operational circuitry; and
   test interface circuitry electrically coupled to the operational circuitry and including means for receiving the interrogating information from the data evaluation means of the interrogator unit, the test interface circuitry test cycling the operational circuitry according to the interrogating information, the test interface circuitry including means for transmitting via radio communication test data output by the operational circuitry in response to the interrogating information back to the data evaluation means of the interrogator unit;
   the data evaluation means including means for examining the test data to determine whether the integrated circuit chip has a defect.

5. A testing system according to claim 4, further comprising:
an RF isolating housing for holding the interrogator unit and the integrated circuit chip, the housing defining a chamber which allows radio communication between the interrogator unit and the integrated circuit chip while blocking RF signals exterior to the housing from entering the chamber.

6. A testing system according to claim 4, wherein:
the power transfer means transmits the power signal at a first frequency; and
the data evaluation means transmits the interrogating information at a second frequency different than the first frequency.

7. A testing system according to claim 4, wherein:
the power transfer means transmits the power signal using a first transmission method; and
the data evaluation means transmits the interrogating information using a second transmission method different than the first transmission method.

8. A testing system according to claim 4, wherein:
the power transfer means transmits the power signal at a first frequency; and
the data evaluation means transmits the interrogating information at a second frequency different than the first frequency; and
the test interface circuitry transmits the test data at a third frequency different than the first and second frequencies.

9. A testing system according to claim 4, wherein:
the power transfer means transmits the power signal using a first transmission method; and
the data evaluation means transmits the interrogating information using a second transmission method different than the first transmission method; and
the test interface circuitry transmits the test data using a third transmission method different than the first and second transmission methods.

10. A testing system according to claim 4, wherein:
the data evaluation means of the interrogator unit includes means for providing an identification code as part of the interrogating information;
and wherein the integrated circuit chip further comprises:
tag means for storing an ID label identifying the integrated circuit chip; and
the test interface means including discriminating means for comparing the identification code sent by the data evaluation means with the ID label stored by the tag means, the test interface means test cycling the operational circuitry when the identification code matches the ID label.

11. A testing system for evaluating integrated circuit chips comprising:
(A) an RF isolated housing defining a chamber, the housing blocking RF signals originating external to the housing from entering the chamber;
(B) an interrogator unit having a transmitting device provided in the housing and having a radio communication range, the interrogator unit comprising:
power transfer means for transmitting within the chamber via radio communication a power signal having a power inducing frequency and amplitude;
data evaluation means for transmitting identification codes and interrogating information within the chamber via radio communication and for receiving test data via radio communication;
(C) multiple integrated circuit chips positioned within the chamber and remotely from the interrogator unit, but within the radio communication range, individual integrated circuit chips comprising:
operational circuitry;
power circuitry electrically coupled to the operational circuitry and including means for receiving the power signal from the power transfer means of the interrogator unit, the power circuitry generating power from the power signal and supplying the power to the operational circuitry;
tag means for storing an ID label identifying the individual integrated circuit chip; and
test interface circuitry electrically coupled to the operational circuitry and including (1) means for receiving the interrogating information from the data evaluation means of the interrogator unit and (2) discriminating means for comparing the identification code sent by the data evaluation means with the ID label stored by the tag means, the test interface circuitry test cycling the operational circuitry according to the interrogating information when the identification code matches the ID label, the test interface circuitry further including means for transmitting via radio communication test data output by the operational circuitry in response to the interrogating information back to the data evaluation means of the interrogator unit;
the data evaluation means examining the test data to determine whether the integrated circuit chip has a defect.

12. A testing system according to claim 11, wherein:
the power transfer means transmits the power signal at a first frequency; and
the data evaluation means transmits the interrogating information at a second frequency different than the first frequency.

13. A testing system according to claim 11, wherein:
the power transfer means transmits the power signal using a first transmission method; and
the data evaluation means transmits the interrogating information using a second transmission method different than the first transmission method.

14. A testing system according to claim 11, wherein:
the power transfer means transmits the power signal at a first frequency; and
the data evaluation means transmits the interrogating information at a second frequency different than the first frequency; and
the test interface circuitry transmits the test data at a third frequency different than the first and second frequencies.

15. A testing system according to claim 11, wherein:
the power transfer means transmits the power signal using a first transmission method; and
the data evaluation means transmits the interrogating information using a second transmission method different than the first transmission method; and
the test interface circuitry transmits the test data using a third transmission method different than the first and second transmission methods.

16. A method for testing an integrated circuit chip having operational circuitry formed thereon, comprising the following steps:

forming test interface circuitry on the integrated circuit chip, the test interface circuitry being electrically coupled to the operational circuitry;

providing an interrogator unit having a radio communication range;

locating the integrated circuit chip remotely from the interrogator unit, but within the radio communication range;

powering the operational circuitry and the test interface circuitry;

transmitting interrogating information from the interrogator unit to the test interface circuitry on the integrated circuit chip via radio communication;

test cycling the operational circuitry according to the interrogating information;

transmitting test data output by the operational circuitry in response to the interrogating information back to the interrogator unit via radio communication; and examining the test data at the interrogator unit to determine whether the integrated circuit chip has a defect.

17. A method according to claim 16, further comprising the following steps:

marking the integrated circuit chip with an ID label;

transmitting an identification code from the interrogator unit;

comparing the identification code with the ID label; and test cycling the operational circuitry only when the identification code matches the ID label.

18. A method for testing an integrated circuit chip having operational circuitry formed thereon, comprising the following steps:

forming power circuitry on an integrated circuit chip having operational circuitry, the power circuitry being electrically coupled to the operational circuitry;

forming test interface circuitry on the integrated circuit chip, the test interface circuitry being electrically coupled to the operational circuitry;

providing an interrogator unit having a radio communication range;

locating the integrated circuit chip remotely from the interrogator unit, but within the radio communication range;

transmitting a power signal having a power inducing frequency and amplitude from the interrogator unit to the power circuitry on the integrated circuit chip via radio communication;

generating power in the integrated circuit chip from the power signal;

supplying the power to the operational circuitry;

transmitting interrogating information from the interrogator unit to the test interface circuitry on the integrated circuit chip via radio communication;

test cycling the operational circuitry according to the interrogating information;

transmitting test data output by the operational circuitry in response to the interrogating information back to the interrogator unit via radio communication; and examining the test data at the interrogator unit to determine whether the integrated circuit chip has a defect.

19. A method according to claim 18, further comprising the following step:

transmitting the power signal and the interrogating information using a spread spectrum technique.

20. A method according to claim 18, further comprising the following steps:

transmitting the power signal at a first frequency; and transmitting the interrogating information at a second frequency different than the first frequency.

21. A method according to claim 18, further comprising the following steps:

transmitting the power signal at a first frequency;

transmitting the interrogating information at a second frequency different than the first frequency; and transmitting the test data at a third frequency different than the first and second frequencies.

22. A method according to claim 18, further comprising the following steps:

marking the integrated circuit chip with an ID label;

transmitting an identification code from the interrogator unit;

comparing the identification code with the ID label; and test cycling the operational circuitry only when the identification code matches the ID label.

* * * * *

UNITED STATES PATENT AND TRADEMARK OFFICE
CERTIFICATE OF CORRECTION

PATENT NO.    : 6,058,497
DATED         : May 2, 2000
INVENTOR(S)   : Mark E. Tuttle It is certified that error appears in the above-identified patent and that said Letters Patent are hereby corrected as shown below:

Column 4, line 36, replace "transmits and s receives" with --transmits and receives--.

Signed and Sealed this

Tenth Day of April, 2001

Attest:

NICHOLAS P. GODICI

Attesting Officer

Acting Director of the United States Patent and Trademark Office